US005480994A

United States Patent [19]
Ali

[11] Patent Number: 5,480,994
[45] Date of Patent: Jan. 2, 1996

[54] AMINOKETONE SENSITIZERS FOR AQUEOUS SOLUBLE PHOTOPOLYMER COMPOSITIONS

[75] Inventor: M. Zaki Ali, Woodbury, Minn.

[73] Assignee: Minnesota Mining and Manufacturing Company, St. Paul, Minn.

[21] Appl. No.: 438,252

[22] Filed: May 10, 1995

Related U.S. Application Data

[60] Division of Ser. No. 234,575, Apr. 28, 1994, Pat. No. 5,455,143, which is a continuation-in-part of Ser. No. 182,671, Jan. 14, 1994, abandoned, which is a continuation of Ser. No. 784,467, Oct. 25, 1991, abandoned.

[51] Int. Cl.$^6$ .................... C07D 405/00; C07D 453/02; C07D 311/02
[52] U.S. Cl. .................... 546/196; 546/66; 546/133; 546/244; 549/287
[58] Field of Search .................... 549/287; 546/133, 546/138, 196, 66

[56] References Cited

U.S. PATENT DOCUMENTS

| | | | |
|---|---|---|---|
| 4,147,552 | 4/1979 | Specht et al. | 96/115 R |
| 4,278,751 | 7/1981 | Specht et al. | 430/281 |
| 4,289,844 | 9/1981 | Specht et al. | 430/281 |
| 4,366,228 | 12/1982 | Specht et al. | 430/281 |
| 4,369,310 | 1/1983 | Postle | 542/442 |
| 4,507,382 | 3/1985 | Rousseau et al. | 430/275 |
| 4,576,975 | 3/1986 | Reilly, Jr. | 522/13 |
| 4,713,312 | 12/1987 | Adair et al. | 430/130 |
| 4,755,450 | 7/1988 | Sanders et al. | 430/285 |
| 4,921,827 | 5/1990 | Ali et al. | 502/167 |

FOREIGN PATENT DOCUMENTS

| | | |
|---|---|---|
| 0538997A1 | 8/1992 | European Pat. Off. . |
| 63-168403 | 7/1988 | Japan . |
| 63-309502 | 12/1988 | Japan . |

OTHER PUBLICATIONS

The Merck Index, Ninth Edition (1976) M. Windholz et al., Ed. Compound #7904 p. 1052.

*Primary Examiner*—Bernard Dentz
*Assistant Examiner*—Amelia Owens
*Attorney, Agent, or Firm*—Gary L. Griswold; Walter N. Kirn; Susan Moeller Zerull

[57] ABSTRACT

Aminoketone-substituted coumarin sensitizers having quaternary amine substituents are described which have very high photosensitivity, and are useful in moderate pH aqueous-developable printing plates.

The aminoketone-substituted coumarin sensitizers are described by the formula:

[Chemical structure shown with substituents $R_1$, $R_2$, $R_3$, $R_4$, $R_5$, $R_6$, $R_7$, $R_8$, $R_9$ and anion $X^-$]

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms, $R_5$ represents an alkyl group having 1 to 6 carbon atoms or H, $R_6$ represents an alkylene group having 1 to 16 carbon atoms, an oxyalkylene group having form 1 to 16 carbon atoms, or a poly(oxyalkylene) group in which said alkylene group has 2 to 4 carbon atoms and the number of oxygen atoms is a positive integer less than or equal to four, $R_7$, $R_8$, and $R_9$ each independently represent an alkyl group having 1 to 6 carbon atoms, or any two of $R_7$, $R_8$, and $R_9$ taken together represent an alkylene group having 4 to 6 carbon atoms; $R_7$, $R_8$, and $R_9$ taken together with the N atom to which they are bonded represent a quinuclidinio group, or $R_6$, taken together with $R_7$, $R_8$, or $R_9$ represent a five, six, or seven membered heterocyclic ring group, and $X^-$ represents any anion.

Photopolymer compositions comprising a free-radically polymerizable material, a photoinitiator, and an aminoketone-substituted coumarin sensitizer having quaternary amine substituents, are also disclosed.

6 Claims, No Drawings

AMINOKETONE SENSITIZERS FOR AQUEOUS SOLUBLE PHOTOPOLYMER COMPOSITIONS

This is a division of application No. 08/234,575 filed Apr. 28, 1994 now U.S. Pat. No. 5,455,143, which is a continuation-in-part of application Ser. No. 08/182,671 filed Jan. 14, 1994, abandoned, which is a continuation of application Ser. No. 07/784,467 filed Oct. 25, 1991 abandoned.

BACKGROUND OF THE INVENTION

1. Field of the Invention

This invention relates to spectral sensitizers useful in moderate pH aqueous-developable and aqueous-coatable photopolymer formulations. More particularly this invention relates to aqueous-soluble aminoketone sensitizers.

Background of the Art

Photoinitiators for polymerization reactions ordinarily have an inherent, but limited range of natural radiation sensitivity. Only when the photoinitiators are stimulated by these particular ranges or wavelengths of sensitivity do the photoinitiators display their desired functional ability. It is not feasible and/or economic to attempt to provide different photoinitiators for each different range of wavelengths to which one would desire a polymerizable system to be sensitive. It is therefore better to find ways of changing the wavelength range of sensitivity for a given photoinitiator. Changes in sensitivity can be made by structural alteration of the photoinitiator, but a more accepted and more easily performed method is spectral sensitization of the photoinitiator. This procedure is commonly practiced by finding dyes which absorb radiation in the described range of wavelengths and which activate the photoinitiator after absorption of the radiation. For each photoinitiator system it is difficult to predict which specific dyes will be able to effectively act as efficient sensitizers. Even though some dyes may work with more than one photoinitiator (or other photosensitive systems such as silver halides, tetrahydrocarbyl borates, etc.), there is seldom any certainty that a compound or class of compounds will work with a particular photoinitiator.

Since many spectral sensitizing dyes absorb visible radiation to perform their function, they may be colored and add an undesirable color, tone, or hue to the polymerized material. It is often desirable to provide spectral sensitizing dyes which may be tested to lose their color after they have been used as spectral sensitizers. This can be accomplished in many ways such as thermal bleaching or photobleaching of the dyes.

Sensitizers may also be used which merely increase the speed (sensitivity) of the photoinitiators at those wavelengths to which they are naturally sensitive.

Light-bleachable sensitizers for silver halide imaging having solubilizing quaternary nitrogen substituents have been reported in EPO 029,412 (Postle; publication date Nov. 19, 1979). Those sensitizers are based on an aminobenzylidenemalonitrile structure and are not aminoketones. Their utility in inducing free radical polymerization is unknown.

Japanese published applications 63-168403 (Fuji; publication date Jul. 12, 1988) and 63-309502 (Hitachi; publication date Jul. 12, 1988) generically claims photopolymerizable compositions containing aminoketone and ketocoumarin sensitizing dyes. Neither application describes any specific examples which are within the scope of or demonstrate the surprising increases in speed associated with the instant invention.

Aromatic aminoketones having carboxyl and amino substituents are disclosed in and U.S. Pat. No. 4,755,450 (Sanders; Jul. 5, 1988). Although some of these are soluble in developers with a pH>7.5 are not within the scope of the instant invention, and do not teach speed enhancement by incorporation of a water solubilizing substituent.

Benzophenone and thioxanthone photoinitiators having quaternary ammonium substituents have been described in EPO 279,475 (Nicholl et al.; publication date Aug. 24, 1988), EPO 224,967 (Gwane et al., publication date Jun. 10, 1987) and Davies, M. J.; Gwane, G.; Green, P. N.; Green, W. N. *Spec. Publ. -R. Soc. Chem.* 1987, 64, 184–5. U.S. Pat. No. 4,602,097 (Curtis; Jul. 22, 1986) discloses water soluble photoinitiators with tetraalkylammonium substituents connected through a (poly)ethylene oxide linking group. The abovesaid photoinitiators are not suitable for use with visible wavelength light sources, and are neither aminoketones nor sensitizers.

Specht et al. (U.S. Pat. Nos. 4,147,552, Apr. 3, 1979; 4,289,844, Sep. 15, 1981, and 4,278,751; Jul. 14, 1981) discloses aminoketone-substituted coumarins having a variety of substituents including methylpyridinium and anilinium substituents. Said quaternary ammonium substituted coumarin sensitizers materials do not fall within the formula of the instant invention. Additionally, they achieve water solubility at the expense of photosensitivity (i.e., speed). In contrast, the sensitizers of the present invention achieve water solubility while enhancing the speed.

Adair et al. (U.S. Pat. No. 4,713,312; Dec. 15, 1987) discloses the use of aminoketone-substituted coumarin sensitizers as sensitizers for photosensitive microcapsules. Those material disclosed are essentially those of U.S. Pat. No. 4,147,552, and must be non-aqueous soluble in order to be incorporated into capsules.

Reilly (U.S. Pat. No. 4,576,975; Dec. 18, 1986) describes Michler's ketone analogues with water solubilizing carboxylate substituents. Those sensitizers have different structural formulae from the dyes of the present invention, both in their skeleton and in their solubilizing substituent.

What the prior art has not taught, but this invention teaches is that aminoketone-substituted coumarin sensitizers of the instant invention provide unexpected increases in photosensitivity while achieving aqueous solubility at moderate pH (i.e., pH 5–11) values.

SUMMARY OF THE INVENTION

This invention relates to aqueous-soluble sensitizers for free-radical photopolymerization.

This invention also relates to aqueous coatable and aqueous-developable imaging compositions comprising an aqueous-soluble sensitizer, a photoinitiator and a free radically polymerizable monomer.

The invention is achieved by providing aminoketone-substituted coumarin sensitizers, described by the formula:

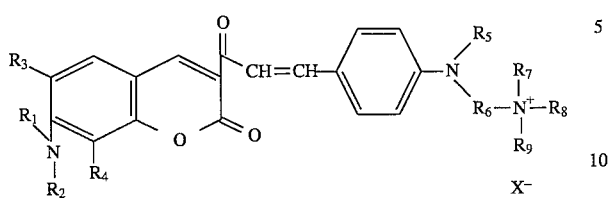

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms.

$R_5$ represents an alkyl group having 1 to 6 carbon atoms or H.

$R_6$ represents an alkylene group having 1 to 16 carbon atoms, an oxyalkylene group having form 1 to 16 carbon atoms, or a poly(oxyalkylene) group in which said alkylene group has 2 to 4 carbon atoms and the number of oxygen atoms is a positive integer less than or equal to four, $R_7$, $R_8$, and $R_9$ each independently represent an alkyl group having 1 to 6 carbon atoms, or any two of $R_7$, $R_8$, and $R_9$ taken together represent an alkylene group having 4 to 6 carbon atoms; $R_7$, $R_8$, and $R_9$ taken together with the N atom to which they are bonded represent a quinuclidinio group, or $R_6$, taken together with $R_7$, $R_8$, or $R_9$ represent a five, six, or seven membered heterocyclic ring group, $X^-$ represents any anion.

DETAILED DESCRIPTION OF THE INVENTION

Aqueous-soluble photopolymer compositions have been recognized in the industry as one means for reducing volatile organic emissions during the manufacture and subsequent development of lithographic plates. The conversion of organic solvent-based photopolymer compositions to aqueous solvent-based photopolymer compositions has presented a variety of technical problems. Among these problems has been the need for spectral sensitizers of high sensitivity which are soluble enough in water-based solvents for coating and which provide good developability in aqueous developers. Aminoketone spectral sensitizers have been proven to be useful sensitizers for iodonium salt containing photopolymerizable compositions (for example see U.S. Pat. No. 3,729,313 (Smith); Apr. 24, 1973), but these materials have little to no solubility in water-based solvent systems of moderate pH (i.e., pH 5-11 units). The instant invention overcomes this problem by incorporating a quaternary ammonium substituent into the aminoketone sensitizer, thereby enhancing aqueous solubility. The term "aminoketone" as used herein means a chemical substance having within its structural formula the sub-structure:

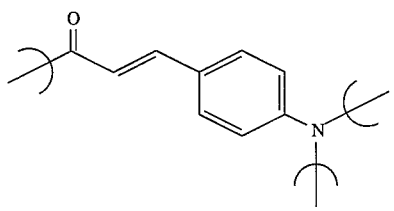

The choice of quaternary ammonium as opposed to the many other available solubilizing groups, as a solubilizing substituent, imparts very high solubility in aqueous-based solvents. Additionally, the sensitizers of the instant invention were found to have higher photosensitivity in aqueous-based printing plate applications than sulfonated aminoketones of the prior art, and surprisingly even higher photospeed than the parent unsubstituted aminoketones of the prior art.

The aminoketone sensitizers of the instant invention are preferably described by the following formula:

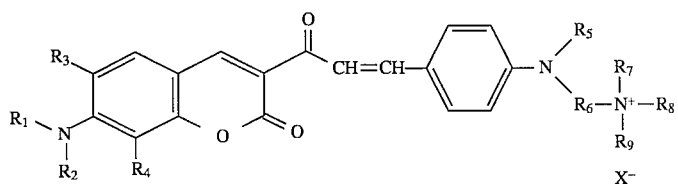

wherein $R_1$ and $R_2$ each represent an alkyl group having 1 to 6 carbon atoms, and $R_3$ and $R_4$ each represent hydrogen; or at least one of $R_1$ and $R_3$ or R2 and R4 together represent an alkylene group having 2 to 4 carbon atoms, $R_5$ represents an alkyl group having 1 to 6 carbon atoms or H, $R_6$ represents an alkylene group having 1 to 16 carbon atoms, an oxyalkylene group having form 1 to 16 carbon atoms, or a poly(oxyalkylene) group in which said alkylene group has 2 to 4 carbon atoms and the number of oxygen atoms is a positive integer less than or equal to four, $R_7$, $R_8$, and $R_9$ leach independently represent an alkyl group having 1 to 6 carbon atoms, or any two of $R_7$, $R_8$, and $R_9$ taken together represent an alkylene group having 4 to 6 carbon atoms; $R_7$, $R_8$, and $R_9$ taken together with the N atom to which they are bonded represent a quinuclidinio group, or $R_6$, taken together with $R_7$, $R_8$, or $R_9$ represent a five, six, or seven membered heterocyclic ring group, and X⁻ represents any anion. Examples of anions are well known in the imaging art and include, but are not limited to, anions with a unitary negative charge such as chloride, bromide, iodide, alkyl and aryl carboxylates, alkyl and aryl sulfonates, bicarbonate, hexafluorophosphate, etc., and anions with a negative charge greater than 1 such as sulfate, phosphate, and the like. Preferably X⁻ represents iodide, chloride, bromide, tetrafluoroborate, hexafluoroantimonate, or hexafluorophosphate. It is of course preferred that the anion not provide any function that might interfere with the properties (e.g. solubility, spectral absorption) of the sensitizer or the polymerization reaction which it is to help initiate.

The sensitizers of the instant invention are especially useful when employed in imageable layers comprising aqueous-developable photosensitive compositions. The aqueous-developable photosensitive compositions may comprise a water-based solvent soluble free-radical polymerizable monomer or oligomer, a photoinitiator, and optionally a binder.

Examples of suitable monomers of this invention include, but are not limited to, ethylenically unsaturated free radical polymerizable monomers and acrylate, methacrylate, and acrylamide moiety containing monomers (e.g., ethyl methacrylate, pentaerythritol triacrylate, pentaerythritol tetraacrylate, N-ethylacrylamide, etc.), while suitable oligomers include, but are not limited to, ethylenically unsaturated or acrylate (methacrylate) end-capped urethane, acrylate, and polyether oligomers.

The water-soluble aminoketone-substituted coumarin sensitizers of the instant invention are used in combination with a photoinitiator. Preferred photoinitiators are halomethyltriazines (described in U.S. Pat. No. 3,775,113) and diaryliodonium salts (described in U.S. Pat. Nos. 3,729,313, 4,058,400, 4,058,401, and 4,921,827), hereby incorporated by reference. Additional sensitizers may also be used with the sensitizers at the present invention.

The preferred diaryliodonium salts useful in practice of the instant invention may be generally described by the formulae given in U.S. Pat. No. 4,460,154, that is

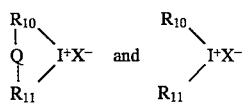

wherein $R_{10}$ and $R_{11}$ are individually selected from aromatic groups. Such aromatic groups may have from 4 to 20 carbon atoms (e.g., substituted or unsubstituted phenyl, naphthyl, thienyl, and furanyl) with substantially any substitution, Q is selected from a carbon-carbon bond, oxygen, sulfur,

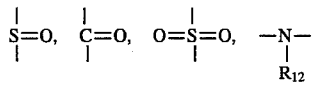

wherein $R_{12}$ is aryl (e.g., 6 to 20 carbon atoms) or acyl (e.g., 2 to 20 carbon atoms), or $R_{13}$—C—$R_4$ wherein $R_{13}$ and $R_{14}$ are selected from hydrogen, alkyl groups of 1 to 4 carbon atoms, and alkenyl groups of 2 to 4 carbon atoms, and X⁻ an anion, preferably an acidic or complex halogenated anion.

Examples of diaryliodonium cations useful in the practice of the instant invention are diphenyliodonium, di(4-chlorophenyl)iodonium, 4-trifluoromethylphenylphenyliodonium, 4-ethylphenylphenyliodonium, di(4-acetylphenyl)iodonium, tolylphenyliodonium, anisylphenyliodonium, 4-butoxyphenylphenyliodonium, di(4-phenylphenyl)iodonium, di(carbomethoxyphenyl)iodonium, etc. Examples of the iodonium cations are disclosed in U.S. Pat. Nos. 3,729,3 13, 4,076,705, and 4,386,154.

Examples of substituted halomethyltriazines useful in the practice of the instant invention are 2,4-bis(trichloromethyl)-6-methyl-s-triazine, 2,4,6-tris(trichloromethyl)-s-triazine, and styryl substituted triazines such as 2,4-bis(trichloromethyl)-6-(4'-methoxystyryl)-s-triazine, 2,4-bis(trichloromethyl)-6 -(p-dimethylaminostyryl)-s-triazine, 2,4-bis(trichloromethyl)-6-(2',4'-diethoxystyryl)-s-triazine, etc. These compounds are described as noted above in U.S. Pat. Nos. 3,515,552, 3,536,489, 3,617,288, 3,640,718, 3,779,778, 4,386,154, 3,954,475, and 3,987,037.

Photopolymerization of the photosensitive compositions of the instant invention occurs on exposure of the compositions to any source of radiation emitting actinic radiation at a wavelength within the ultraviolet and visible spectral regions. Suitable sources of radiation include, but are not limited to mercury, xenon, carbon arc and tungsten filament lamps, lasers, sunlight, etc. Exposures may be from less than about 1 microsecond to 10 minutes or more depending upon the amounts of particular polymerizable materials, the photoinitiator being utilized and depending upon the radiation source and distance from the source and thickness of the coating to be cured. The photoinitiator is used at a concentration of about 0.01 to 10 percent by weight of the solids content of the coated and dried photosensitive composition.

The photosensitive compositions of the instant invention are normally coated onto a substrate for use in various imaging applications. Substrates may be transparent or opaque. Suitable substrates on which the compositions of the instant invention may be supported include, but are not limited to, metals (for example, steel and aluminum plates including aluminum treated with hydrophilizing agents such as silicates or polyacrylic acid and its derivatives, sheets, and foils); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), poly(hexamethylene adipamide/adipate)). Aluminum is a preferred substrate. Silicated and/or anodized aluminum is particularly preferred.

A binder may optionally be present in photosensitive compositions of the instant invention. Any natural or synthetic aqueous solvent-soluble (or even nonaqueous solvent-soluble in amounts up to about 25 percent by weight) polymeric binder may be used in the practice of this invention. Organic polymeric resins may be used. Thermoplastic resins are generally preferred. Examples of suitable binders are sulfonated polystyrene, polyvinyl alcohol, starch, polymethyl methacrylate, polyvinyl acetate, and the like. Beyond these minimal requirements, there is no criticality in the selection of a binder. In fact, even transparency or translucency are not required although they are desirable.

Water-based solvents useful in developing the photopolymerizable compositions of the instant invention are those which have at least 20 weight percent and up to 100 weight percent water. While water-based solvents may be used for both manufacture (i.e., coating of the photopolymerizable composition onto a substrate) and development of the latent image, it is recognized that other solvents with lesser water content may be used in either or both of the aforementioned processes. The water-based solvents useful in the instant invention may include one or more organic solvents, surfactants, stabilizers, or inorganic bases.

The imageable layers of the instant invention may contain various materials in combination with the essential ingredients of the instant invention. For example, plasticizers, coating aids, antioxidants in amounts sufficient to prevent premature cross-linking, but insufficient to prevent crosslinking of the energy sensitive polymers (e.g., ascorbic acid, hindered phenols, phenidone, etc.), surfactants, antistatic agents, waxes, mild oxidizing agents, and brighteners may be used without adversely affecting the practice of the invention.

Where the term group is used in describing substituents, substitution is anticipated on the substituent. For example, alkyl group includes ether groups (e.g., $CH_3$—$CH_2$—$CH_2$—$O$—$CH_2$—), haloalkyls, nitroalkyls, carboxyalkyls, hydroxyalkyls, sulfoalkyls, etc., while the term alkyl or alkyl moiety includes only hydrocarbons. Substituents which react with active ingredients, such as very strong reducing or oxidizing substituents, would of course be excluded as not being sensitometrically inert or harmless.

EXAMPLES

In the examples below, the following abbreviations are used: VDM refers to vinyldimethylazlactone; HEMA refers to 2-hydroxymethyl methacrylate; ASATBA refers to tetrabutylammonium aspartate; DMAEMA-$C_{16}$ refers to 2-dimethylaminoethyl methacrylate quaternized with 1-bromohexadecane as described in copending case U.S. Ser. No. 07/658,983.

All chemicals used below were obtained from Aldrich Chemical Co., Milwaukee, Wis.) unless otherwise specified. Products were characterized by one or more of the following techniques: $^1$H nuclear magnetic resonance, ultraviolet-visible, and infrared spectroscopies; melting point.

Example 1

1-Methyl-(4-methylamino)piperidine (51.2 g), 66 ml dimethyl sulfoxide, 33.0 g 4-fluorobenzaldehyde, and 53.3 g potassium carbonate were combined in a 500 ml three-necked flask fitted with a mechanical stirrer and a condenser. The stirred solution was heated to 90° C. for 72 hr. After cooling to room temperature the mixture was poured into 1 liter of water with stirring. The mixture was extracted with 300 ml ethyl acetate. The organic layer was washed with 100 ml water, then dried over anhydrous magnesium sulfate.

Upon filtration and evaporation of the ethyl acetate under reduced pressure 35.0 g of N-methyl-N-(N-methylpiperidin-4-yl)-4-aminobenzaldehyde (1) was obtained as a liquid.

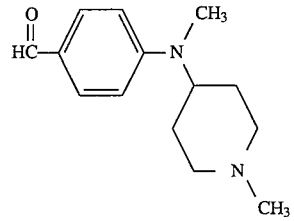

Example 2

Coumarin 334 (Eastman Kodak, Rochester, N.Y.) 0.28 g, 0.24 g 1 (prepared in Example 1), 0.10 g piperidinium acetate, and 40 ml toluene were combined in a 100 ml round-bottomed flask equipped with a Dean-Stark trap and condenser. The solution was refluxed for 21 hr with removal of water collected in the Dean-Stark trap. The solvent was then removed under reduced pressure and 50 ml water was added. The precipitated solid was filtered, washed with cold ethanol, and dried to give 10-(3-(N-methyl-N-(N-methylpiperidin-4-yl)-4-aminophenyl)propenoyl)-1H,2H,3H,5H, 6H,7H,11H-[1]benzopyrano[6,7,8-ij]quinolizin- 11-one (2) as a red dye; $\lambda_{max}$ (ethanol)=495 nm.

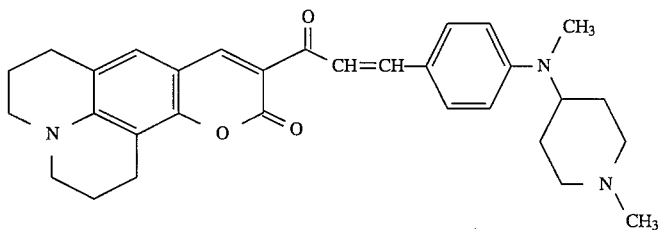

Example 3

Dimethyl sulfate (5 drops) was added to a stirred solution of 0.20 g 2 in 5 ml dichloromethane and the solution was heated to about 30° C. for 1 hr. The mixture was allowed to cool to room temperature and the precipitated (highly water-soluble) red solid 10-(3-(N-methyl-N-(N,N-dimethylpiperidinio-4-yl)4-aminophenyl)propenoyl)-1H,2H,3H,5 H,6H, 7H,11H-[1]benzopyrano[6,7,8-ij]quinolizin-11-one methylsulfate (3) was filtered and dried; $\lambda_{max}$ (ethanol)=492 nm, $\lambda_{max}$ (water)=500 nm.

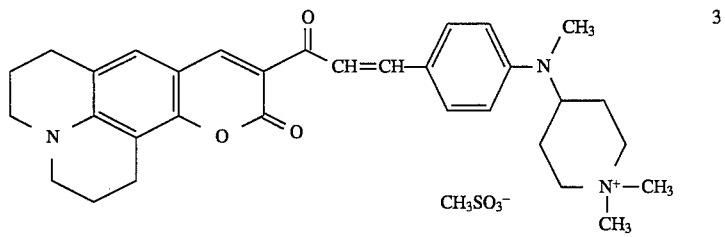

3

Example 4

3-acetyl-7-diethylaminocoumarin (1.04 g, prepared according to the procedure described in U.S. Pat. No. 4,147,552), 1.20 g N-(2-piperidinoethyl)-N-ethyl-4-aminobenzaldehyde, 0.10 g piperidinium acetate, and 40 ml toluene were placed in a 100 ml round-bottomed flask fitted with a Dean-Stark trap and condenser. The solution was refluxed for 16 hr with removal of collected water. The toluene was evaporated under reduced pressure and a mixture of 20 ml water and 5 ml ethanol was added to the resultant viscous material. Upon stirring a solid precipitated which was isolated by filtration and drying to give 1.5 g of 7-diethylamino-3-(3-(N-ethyl-N-(2-piperidinoethyl)-4-aminophenyl)propenoyl)coumarin (4) as a red solid; $\lambda_{max}$ (ethanol)=475 nm.

Example 7

Dimethyl sulfate (5 drops) was added to 0.20 g of 4 in 5 ml toluene. The mixture was heated to about 30° C. for 1 hr and allowed to cool to room temperature. The resultant precipitated solid was filtered and dried to give 0.12 g of 7-diethylamino-3-(3-N-ethyl-N-(2-(N-methylpiperidinio)ethyl)-4-aminophenyl)propenoyl)coumarin methylsulfate (7) as a red solid which was highly soluble in water; $\lambda_{max}$ (water)=485 nm.

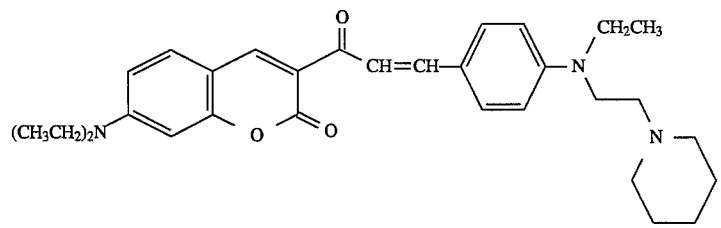

4

Examples 5 and 6

Dyes 5 and 6 were prepared according to the procedure of Example 4 using 4-(diethylamino)benzaldehyde and 1, respectively, in place of the N-(2-piperidinoethyl)-N-ethyl-4-aminobenzaldehyde used in Example 4. The absorption data was: 7-diethylamino-3-(4-diethylaminophenyl)propenoylcoumarin (5), $\lambda_{max}$ (ethanol)=475 nm; 7-diethylamino-3-(N-methyl-N-(N-methylpiperidin-4-yl)-4-aminophenylpropenoyl)coumarin (6), $\lambda_{max}$ (ethanol)=475 nm.

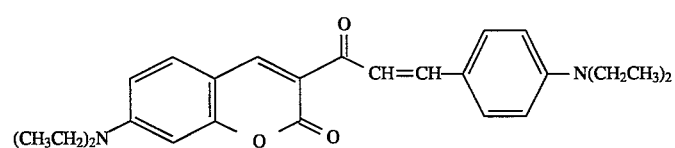

5

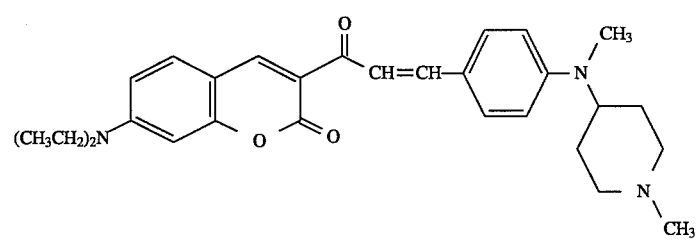

6

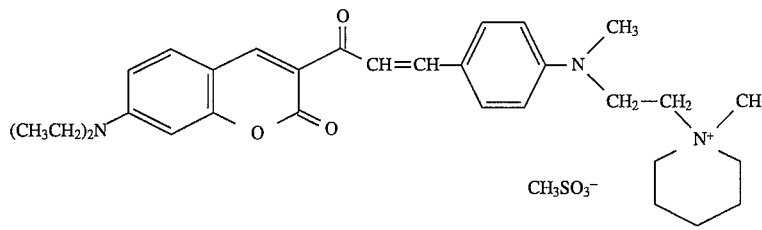

7

Example 8

7-Diethylamino-3-(3-(N-methyl-N-(N,N-dimethylpiperidinio-4-yl)-4-aminophenyl)propenoyl)coumarin methylsulfate (8) was prepared according to Example 7 except that 6 was used in place of 4; $\lambda_{max}$ (water)=473 nm, $\lambda_{max}$ (ethanol)=468 nm.

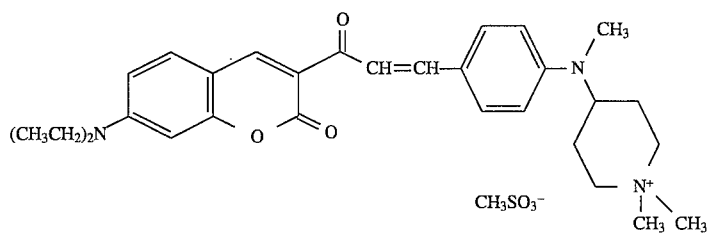

8

Example 9

10-(3-(N-ethyl-N-(2-piperidinoethyl)-4-aminophenyl) propenoyl)-1H,2H,3H,5H,6H,7 H,11H-[1]benzopyrano[6,7,8-ij]quinolizin- 11-one (9) was prepared according to the procedure of Example 4 wherein 3-acetyl-7-diethylaminocoumarin was replaced by Coumarin 334 (Eastman Kodak, Rochester, N.Y.); $\lambda_{max}$ (ethanol)=503 nm

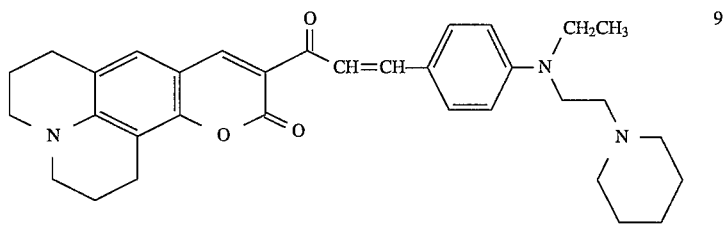

9

Example 10

10-(3-(N-ethyl-N-(2-(N-methylpiperidinio)ethyl)-4-aminophenyl)propenoyl)-1H,2H,3H,5H,6 H,7H,11H-[1]benzopyrano[6,7,8-ij]quinolizin-11-one methylsulfate (10) was prepared according to the procedure of Example 7 wherein 4 was replaced with 9; $\lambda_{max}$ (water)=498 nm, $\lambda_{max}$ (ethanol)=490 nm.

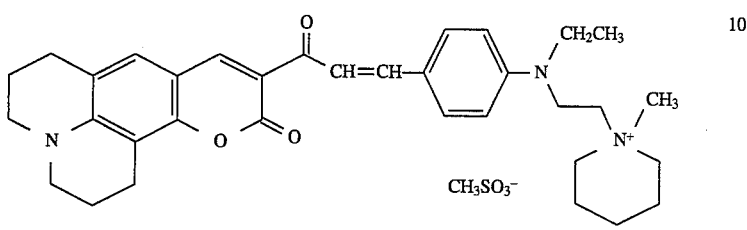

10

Example 11–15

A solution was prepared from (in parts by weight) 1.8 parts pentaerythritol tetraacrylate (SR-295, Sartomer Co., Westchester, Pa.), 3.10 parts carboxyl substituted urethane oligomer P-11 (61% in methyl ethyl ketone, described in U.S. Pat. No. 4,228,232), 6.0 parts of a 10% Formvar™ 12/85 (Monsanto Chemical Co., St. Louis, Mo.) solution in n-propanol/water (72/28), 60.0 parts n-propanol/water (72/28), 0.07 parts triethylamine (sufficient to solubilize the P-11 in n-propanol/water (72/28)). To 5.0 part aliquots of this solution were added 0.02 parts diphenyliodonium hexafluorophosphate (described in U.S. Pat. No. 3,729,313 (Smith), Apr. 24, 1973) and 0.006 parts of the sensitizers shown in Table 1. Electrochemically grained, anodized aluminum sheets were coated with the resultant solutions using a #12 wire wound rod (R & D Specialties, Webster, N.Y.) and dried at 70° C. for 1 minute. The coating weights of the dried plates were approximately 1.61 g $m_{-2}$. The coatings were then overcoated with a 5% by weight solution of poly(vinyl alcohol) (Gelvatol™ 20/30, Monsanto Chemical Co., St. Louis, Mo.) in water having about 0.03% Triton™ X-100 (Rohm and Haas, Philadelphia, Pa.) as surfactant using a #15 wire wound rod. The overcoated plates were then dried at 70° C. for 1 minute, placed in a Berkey Ascor model 1415-42 exposure unit with a 5 kW metal-halide light source, then exposed for 2 seconds at the low intensity setting through a √2 21-step sensitivity guide (Stauffer Graphic Arts Co., South Bend, Ind.). The exposed plates were then developed by wiping with an aqueous developer solution consisting of 3% sodium metasilicate and 4% n-propanol. The number of steps (polymer image) remaining after exposure and development are shown in Table 1. The "ghost" values indicate the lowest exposure from which observable photopolymer was retained on the plate. The "solid" values indicate the exposure level at which the photopolymer appeared to completely cover the exposed step.

TABLE 1

| Example | Sensitizer | $\lambda_{max}$ (ethanol) | Steps Solid/Ghost |
|---|---|---|---|
| 11 | 7 | 470 | 12/14 |
|  |  | 485 (water) |  |
| 13 | 8 | 468 | 12/14 |
|  |  | 483 (water) |  |
| 15 (comparative) | 5 | 475 | 11/13 |
| 12 | 3 | 492 | 16/18 |
|  |  | 500 (water) |  |
| 14 (comparative) | 11 | 500 | 14/16 |

Compound 11 was prepared according to U.S. Pat. No. 4,921,827 and has the formula:

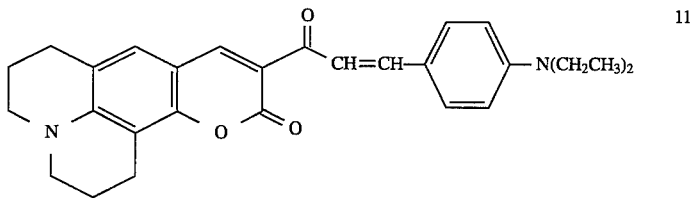

11

Example 17

A solution was prepared from 0.2 parts (by weight) 1,3-diacrylamido-2-hydroxypropane (described in U.S. Pat. No. 4,511,646), 1.0 parts of a polymer having pendant ethylenic, carboxy, and quaternary ammonium groups (33% in methyl ethyl ketone, described in copending U.S. Ser. No. 07/658,983, VDM (95%)/DMAEMA-$C_{16}$ (5%) wherein the VDM groups were modified by reaction with HEMA(70%)/ASATBA (10%)/water (20%)) and 9.0 parts of water/n-propanol (9:1). To a 5.0 parts aliquot of this solution was added 0.02 parts of diphenyliodonium chloride and 0.006 parts of 7. The solution was coated onto an electrochemically grained, anodized, and silicated aluminum substrate using a #12 wire wound rod and dried at 70° C. for 2 minutes. The plate was then top-coated with a 5% aqueous Gelvatol™ 20/30 (a poly(vinyl alcohol) available from Monsanto Chemical Co., St. Louis, Mo.) solution containing 0.03% Triton™ X-100 (a surfactant available from Rohm and Haas, Philadelphia, Pa.) and exposed according to Example 11. The plate was then developed by wiping with a 0.8 percent aqueous solution of sodium bicarbonate. A solid step 7 and ghost step 9 was retained.

Example 18

Another 5.0 part aliquot of the coating solution of Example 17 was combined with 0.02 parts of diphenyliodonium chloride and 0.006 parts of 5. This non-quaternized sensitizer did not go into solution in the substantially water-based solvent, and after coating and exposure no image formation was observed.

Example 19-21

A solution of 0.3 g pentaerythritol tetraacrylate (SR-295, Sartomer Co., 50% in isopropanol/water azeotrope), 1.0 g of a copolymer of VDM (95%) and DMAEMA-$C_{16}$ (5%) wherein the VDM groups were modified by reaction with HEMA (70%)/ASATBA (10%)/water (20%) (i.e., polymer having pendant ethylenic, carboxy, and quaternary ammonium groups) as a 33% solution in methyl ethyl ketone, (described in copending U.S. Ser. No. 07/658,983), and 6.0 g n-propanol water azeotrope. Two 6.0 g aliquots of this solution were each combined with 6 mg of sensitizer and 25 mg tris(trichloromethyl)-s-triazine. These solutions were coated using a #22 wire wound rod (1.98 mil wet thickness) onto a mechanically grained silicated aluminum sheet (substrate A) and an ammonium bifluoride etched and silicated aluminum sheet (substrate B). Each plate was exposed through a √2 21-step sensitivity guide for two seconds in a 3M Model 70 exposure unit (tungsten iodide lamp, 3M Company, St. Paul, Minn.), then developed by mild rubbing with a cotton pad while submerged in 15 a 0.1 N sodium bicarbonate solution. The results are given in Table 2.

TABLE 2

| Example | Sensitizer | Substrate | Solid | Ghost |
|---------|------------|-----------|-------|-------|
| 19 | 10 | A | 14 | 15 |
| 20 | 10 | B | 14 | 15 |
| 21 | 11 | B | 10 | 11 |

What is claimed is:

1. An aminoketone sensitizer for aqueous-developable photopolymer compositions having the formula:

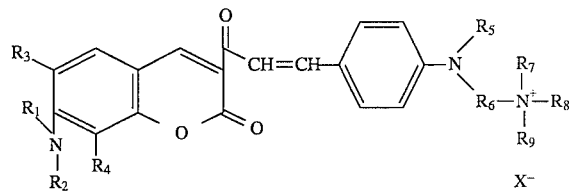

wherein $R_1$ and $R_2$ each represent an alkyl group having 1 to 6 carbon atoms, and $R_3$ and $R_4$ each represent hydrogen; or at least one of $R_1$ and $R_3$ or $R_2$ and $R_4$ together represent an alkylene group having 2 to 4 carbon atoms;

$R_5$ represents an alkyl group having 1 to 6 carbon atoms or H;

$R_6$ represents an alkylene group having 1 to 16 carbon atoms;

$R_7$, $R_8$, and $R_9$ leach independently represent an alkyl group having 1 to 6 carbon atoms, or any two or $R_7$, $R_8$, and $R_9$ taken together represent an alkylene group having 4 to 6 carbon atoms, $R_7$, $R_8$, and $R_9$ taken together with the N atom to which they are bonded represent a quinuclidinio group, or $R_6$, taken together with $R_7$, $R_8$, or $R_9$, represent a five, six, or seven membered heterocyclic ring group, and $X^-$ represents any anion.

2. The aminoketone sensitizer of claim 1 wherein $R_1$ and $R_2$ independently represent an alkyl group or 1 to 6 carbon atoms.

3. The aminoketone sensitizer of claim 1 wherein $R_7$, $R_8$, and $R_9$ independently represent an alkyl group having 1 to 6 carbon atoms.

4. The aminoketone sensitizer of claim 2 wherein $R_7$, $R_8$, and $R_9$ independently represent an alkyl group having 1 to 6 carbon atoms.

5. The aminoketone sensitizer of claim 1 wherein $R_6$, $R_7$, $R_8$, and $R_9$ form an N,N-dimethylpiperidinio-4-yl group with the $N^+$ atom to which they are attached.

6. The aminoketone sensitizer of claim 2 wherein $R_6$, $R_7$, $R_8$, and $R_9$ form an N,N-dimethylpiperidinio-4-yl group with the $N^+$ atom to which they are attached.

* * * * *